(12) United States Patent
Nagami

(10) Patent No.: US 10,788,173 B2
(45) Date of Patent: Sep. 29, 2020

(54) LIGHT EMITTING DEVICE, AREA LIGHT SOURCE DEVICE, AND DISPLAY DEVICE

(71) Applicant: Enplas Corporation, Saitama (JP)

(72) Inventor: Haruto Nagami, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 16/643,568

(22) PCT Filed: Aug. 30, 2018

(86) PCT No.: PCT/JP2018/032108
§ 371 (c)(1),
(2) Date: Mar. 1, 2020

(87) PCT Pub. No.: WO2019/044968
PCT Pub. Date: Mar. 7, 2019

(65) Prior Publication Data
US 2020/0256525 A1    Aug. 13, 2020

(30) Foreign Application Priority Data

Sep. 1, 2017 (JP) ................. 2017-168618

(51) Int. Cl.
*F21S 2/00* (2016.01)
*H01L 33/58* (2010.01)

(52) U.S. Cl.
CPC ............. *F21S 2/005* (2013.01); *H01L 33/58* (2013.01)

(58) Field of Classification Search
CPC ........ G02B 19/0014; F21V 13/04; F21V 5/04
See application file for complete search history.

(56) References Cited

U.S. PATENT DOCUMENTS

| 2004/0079957 A1* | 4/2004 | Andrews | ............... H01L 33/486 257/100 |
| 2013/0107542 A1* | 5/2013 | Fukuda | ............... G02B 3/0056 362/311.01 |
| 2014/0301085 A1* | 10/2014 | Hwang | ............... F21K 9/60 362/308 |

FOREIGN PATENT DOCUMENTS

| JP | 2015-533027 | 11/2015 |
| WO | WO 2019/044968 | 3/2019 |

OTHER PUBLICATIONS

International Search Report and the Written Opinion dated Oct. 30, 2018 From the International Searching Authority Re. Application No. PCT/JP2018/032108 and Its Translation of Search Report Into English. (6 Pages).

* cited by examiner

*Primary Examiner* — Evan P Dzierzynski

(57) ABSTRACT

This light emitting device comprises a light emitting element and a light bundle control member. The light bundle control member includes an input surface, an output surface, a back surface, a leg portion, and a diffusion portion. An inner base portion on the radially inner side of the leg portion is positioned on the back side with respect to an outer base portion on the radially outer side. A radially outer side surface of the leg portion includes a partial output surface which is inclined to become closer to the front side with increasing distance from a central axis. Part of light emitted from the side surface of the light emitting element enters via the input surface, is emitted out of the partial output surface without passing through other surfaces, and again enters the light bundle control member from the diffusion portion.

6 Claims, 10 Drawing Sheets

LIGHT EMITTING DEVICE, AREA LIGHT SOURCE DEVICE, AND DISPLAY DEVICE

TECHNICAL FIELD

The present invention relates to a light emitting device, a surface light source device and a display device.

BACKGROUND ART

Some transmitting image display apparatuses such as liquid crystal display apparatuses use a direct surface light source device as a backlight. In recent years, direct surface light source devices including a plurality of light emitting elements as the light source have been used.

For example, a direct surface light source device includes a light emitting device (light emitting module) including a substrate (circuit board), a plurality of light emitting elements and a plurality of light flux controlling members (lenses), and a light diffusion member. Each of the light emitting elements is, for example, a light emitting diode (LED) such as a white light emitting diode. The light emitting elements are disposed on the substrate in a lattice. The light flux controlling member that spreads the light of the light emitting element in the plane direction of the substrate is disposed over each light emitting element. The light emitted from the light flux controlling member is diffused by the light diffusion member so as to illuminate an illumination target member (for example, a liquid crystal panel) in a planar fashion (see, for example, PTL 1).

The light emitting device disclosed in PTL 1 includes a substrate, a plurality of light emitting elements, and a plurality of light flux controlling members. The light flux controlling member includes an incidence surface disposed opposite to light emitting element, an emission surface disposed on the side opposite to the incidence surface, a flange connecting between the incidence surface and the emission surface, and a columnar leg part formed on the rear surface on the incidence surface side.

Light emitted from the light emitting element is spread by the light flux controlling member such that the light diffusion plate is illuminated with the light over a wide range. The light having reached the light diffusion plate from each light flux controlling member is transmitted through the light diffusion plate while being diffused, thus uniformly illuminating the planar irradiation target member.

CITATION LIST

Patent Literature

PTL 1
Japanese Unexamined Patent Application Publication (Translation of PCT Application) No. 2015-533027

SUMMARY OF INVENTION

Technical Problem

However, in the light emitting device disclosed in PTL 1, light that has a large emission angle with respect to the optical axis of the light emitting element and is entered from the light incidence surface may be emitted from the side surface of the leg part and may reenter the device from the rear surface so as to be emitted from the emission surface toward a region immediately above the light flux controlling member. In this manner, in the light emitting device disclosed in PTL 1, the light emitted from the light emitting element may become light travelling toward a region immediately above the light flux controlling member, and a bright spot may be formed on the light diffusion plate.

In view of this, an object of the present invention is to provide a light emitting device that can suppress formation of a bright spot on the irradiation target surface. In addition, another object of the present invention is to provide a surface light source device and a display device including the light emitting device.

Solution to Problem

A light emitting device according to an embodiment of the present invention includes: a light emitting element; and a light flux controlling member configured to control a distribution of light emitted from the light emitting element. The light flux controlling member includes: an incidence surface that is an inner surface of a recess that is open at a rear side to intersect a central axis of the light flux controlling member, the incidence surface being configured to allow incidence of the light emitted from the light emitting element; an emission surface disposed on a front side to intersect the central axis, the emission surface being configured to emit, to outside, light entered from the incidence surface; a rear surface extending away from an opening edge of the recess; a leg part protruding from the rear surface toward the rear side; and a diffusion part disposed in the rear surface in a region outside the leg part in a radial direction, the diffusion part being configured to diffuse light incident on the diffusion part. The opening edge of the recess is located on the rear side relative to a front surface of the light emitting element. An inner base part of the leg part is located on the rear side relative to an outer base part of the leg part, the inner base part being located on inside in the leg part in the radial direction, the outer base part being located on outside in the leg part in the radial direction. A radially outer side surface of the leg part includes a partial emission surface that is inclined such that a distance of the partial emission surface from the central axis increases in a direction toward the front side, the radially outer side surface being located on an outer side in the leg part in the radial direction. A part of light emitted from a side surface of the light emitting element is emitted to outside from the partial emission surface not by way of other surfaces after being entered from the incidence surface, and is then reentered into the light flux controlling member from the diffusion part.

A surface light source device according to an embodiment of the present invention includes: the light emitting device; and a light diffusion member configured to allow the light emitted from the light emitting device to pass through the light diffusion member while diffusing the light.

A display device according to an embodiment of the present invention includes: the surface light source device; and a display member configured to be irradiated with light emitted from the surface light source device.

Advantageous Effects of Invention

According to the present invention, a light emitting device, a surface light source device and a display device that can suppress formation of a bright spot on the irradiation target surface can be provided.

DESCRIPTION OF EMBODIMENTS

Figure 1A:
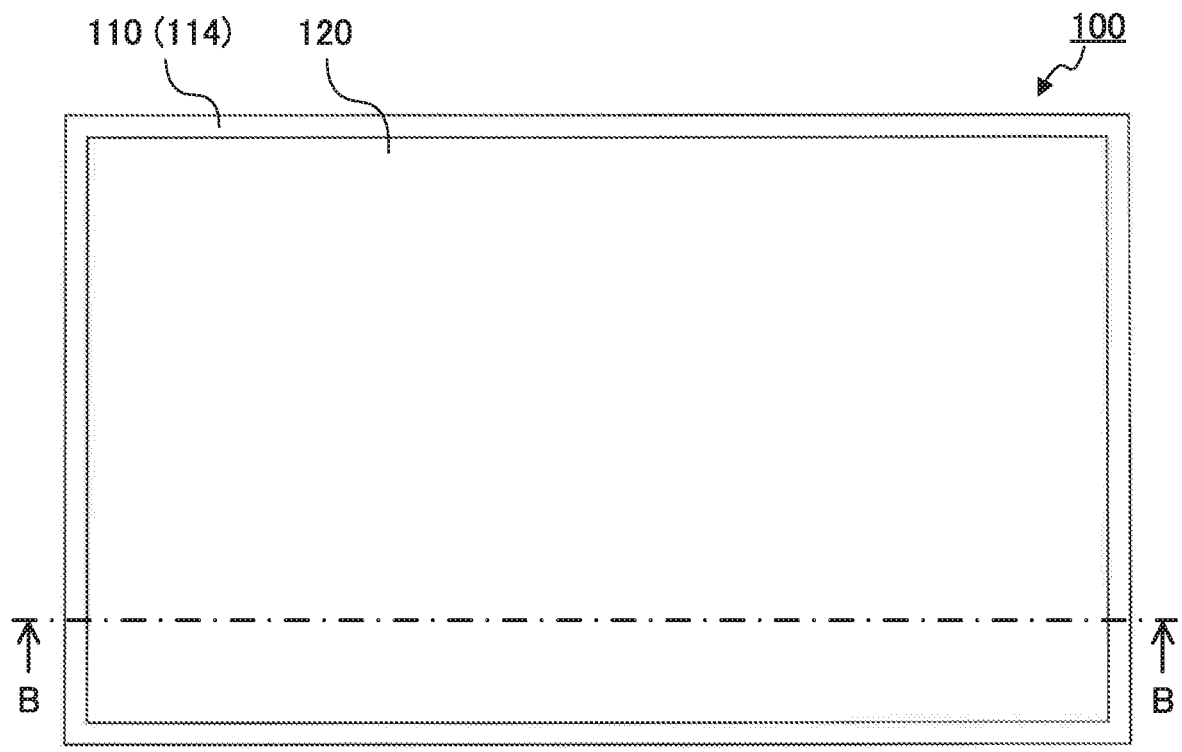
FIGS. 1A and 1B illustrate a configuration of a surface light source device according to an embodiment of the present invention.
Figure 1B:
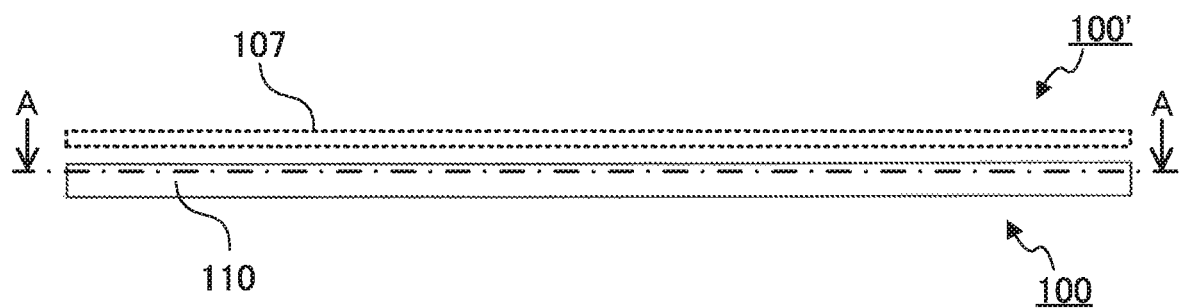
Figure 2A:
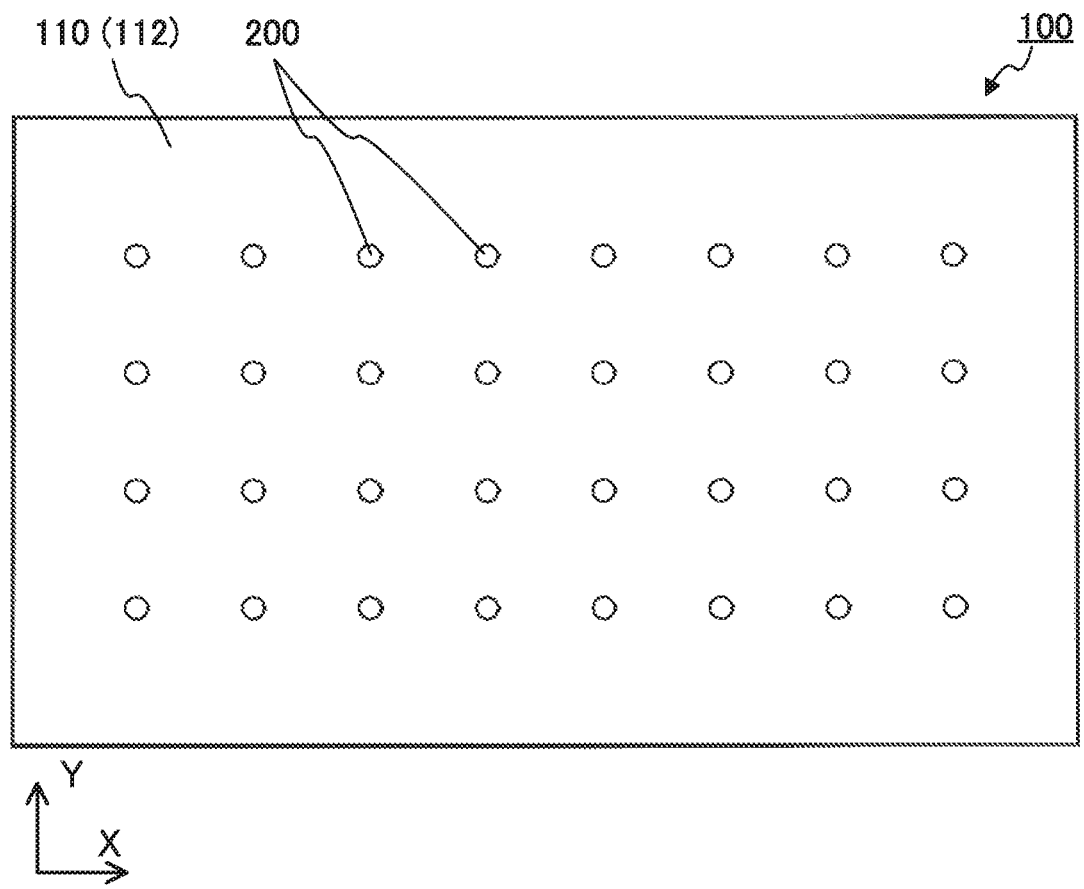
FIGS. 2A and 2B are sectional views illustrating a configuration of the surface light source device.
Figure 2B:
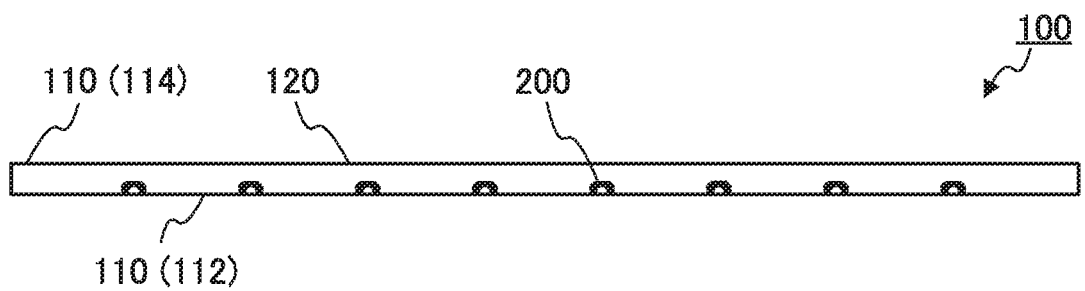
Figure 3:
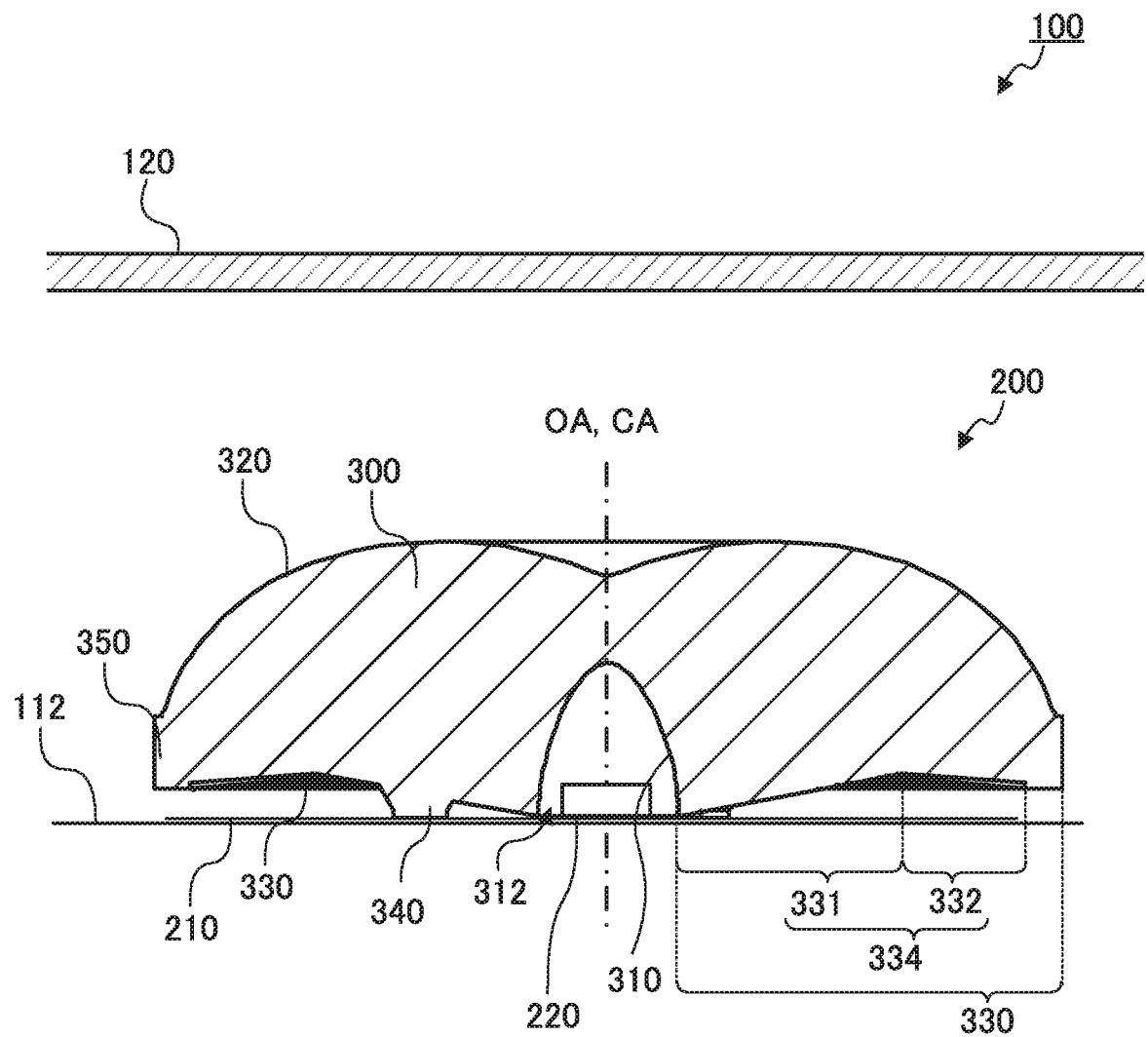
FIG. 3 is a partially enlarged sectional view of the surface light source device.

A light emitting device, a surface light source device and a display device according to the present embodiment are described below with reference to the accompanying drawings. In the following description, as a typical example of the surface light source device according to the present embodiment, a surface light source device that includes light emitting devices disposed in a lattice and is suitable for a backlight of a liquid crystal display apparatus is described. Configurations of Surface Light Source Device and Light Emitting Device FIGS. 1A to 3 illustrate a configuration of surface light source device 100 according to an embodiment of the present invention. FIG. 1A is a plan view of surface light source device 100 according to the embodiment of the present invention, and FIG. 1B is a front view of surface light source device 100. FIG. 2A is a sectional view taken along line A-A of FIG. 1B, and FIG. 2B is a sectional view taken along line B-B of FIG. 1A. FIG. 3 is a partially enlarged sectional view of surface light source device 100.

As illustrated in FIGS. 1A to 3, surface light source device 100 includes housing 110, a plurality of light emitting devices 200, and light diffusion plate (illuminated surface) 120. Surface light source device 100 of the embodiment of the present invention is applicable to a backlight of a liquid crystal display apparatus. In addition, as illustrated in FIG. 1B, surface light source device 100 may be used as display device 100' when used with display member (irradiation target member) 107 (illustrated with a dotted line in FIG. 1B) such as a liquid crystal panel.

A plurality of light emitting devices 200 are disposed in a lattice (in the present embodiment, a square lattice) in substrate 210 on bottom plate 112 of housing 110. The inner surface of bottom plate 112 functions as a diffusive reflection surface. In addition, top plate 114 of casing 110 is provided with an opening. Light diffusion plate 120 is disposed to cover the opening, and functions as a light emitting surface. The light emitting surface has a size of, for example, approximately 400 mm×approximately 700 mm.

A plurality of light emitting devices 200 are disposed on substrate 210 at a predetermined interval. A plurality of substrates 210 are fixed at respective predetermined positions on bottom plate 112 of casing 110. In the present embodiment, a plurality of light emitting devices 200 are disposed such that the light emission centers (the centers of the top surfaces) of light emitting elements 220 form a square lattice. Each light emitting device 200 includes light emitting element 220 and light flux controlling member 300.

Light emitting element 220 is the light source of surface light source device 100, and is mounted on substrate 210. Light emitting element 220 is a light emitting diode (LED) such as a white light emitting diode, for example. Light emitting element 220 is disposed such that the light emission center (the center of the top surface) of light emitting element 220 is located on central axis CA of light flux controlling member 300 (see FIG. 3). Preferably, light emitting element 220 is an LED of chip-on-board (COB) type from the viewpoint of ease of mounting and high light emission efficiency.

LEDs of COB type are known to emit a larger quantity of light in the lateral direction in comparison with conventional LEDs. Light emitting element 220 of an LED of COB type or the like emits a large quantity of light in the lateral direction, and it is therefore necessary to control the light such that a larger quantity of light emitted in the lateral direction from light emitting element 220 enters light flux controlling member 300. As such, it is preferable to dispose light emitting element 220 such that the top surface (the light emitting surface on the upper side) of light emitting element 220 is located on the front side (light diffusion plate 120 side) relative to the lower end (opening edge) of recess 312 described later. Specifically, light emitting element 220 is disposed such that at least a part of light emitting element 220 is located inside the space of recess 312.

Light flux controlling member 300 is a lens, and is fixed on substrate 210. Light flux controlling member 300 operates such that the distribution of light emitted from light emitting element 220 is spread radially outward with respect to central axis CA. Light flux controlling member 300 is disposed over light emitting element 220 in such a manner that its central axis CA matches optical axis OA of light emitting element 220 (see FIG. 3). Note that incidence surface 310 and emission surface 320 of light flux controlling member 300 described later are rotationally symmetrical, and their rotation axes are aligned with optical axis OA of light emitting element 220. The "central axis CA of light flux controlling member" means the rotation axis of incidence surface 310 and emission surface 320. In addition, the "optical axis OA of light emitting element" means a central light beam of a stereoscopic light flux from light emitting element 220.

Light flux controlling member 300 may be integrally shaped by injection molding. The material of light flux controlling member 300 is not limited as long as light of a desired wavelength can pass therethrough. Examples of the material of light flux controlling member 300 include optically transparent resins such as polymethylmethacrylate (PMMA), polycarbonate (PC), epoxy resin (EP), and silicone resin, and glass. A main feature of surface light source device 100 according to the present embodiment is the configuration of light flux controlling member 300. Therefore, the configuration of light flux controlling member 300 is described later in detail.

Light diffusion plate 120 is a plate-shaped member having a light diffusing property, and allows the light emitted from light emitting device 200 to pass therethrough while diffusing the light. Light diffusion plate 120 is disposed over light emitting devices 200 with an air layer therebetween in such a manner that light diffusion plate 120 is approximately parallel to substrate 210. Normally, the size of light diffusion plate 120 is substantially the same as that of the illumination target member such as a liquid crystal panel. For example, light diffusion plate 120 is formed with an optically transparent resin such as polymethylmethacrylate (PMMA), polycarbonate (PC), polystyrene (PS), and styrene methyl methacrylate copolymerization resin (MS). In order to provide a light diffusing property, minute irregularities may be formed in the surface of light diffusion plate 120, or diffusing members such as beads may be dispersed in light diffusion plate 120.

In surface light source device 100 according to the embodiment of the present invention, the light emitted from each light emitting element 220 is spread by light flux controlling member 300 so as to illuminate a wide range of light diffusion plate 120. The light reaching light diffusion plate 120 from each light flux controlling member 300 passes through light diffusion plate 120 while being diffused. Thus, surface light source device 100 according to the embodiment of the present invention can uniformly illuminate a planar illumination target member (e.g., a liquid crystal panel).

Configuration of Light Flux Controlling Member

Figure 4:
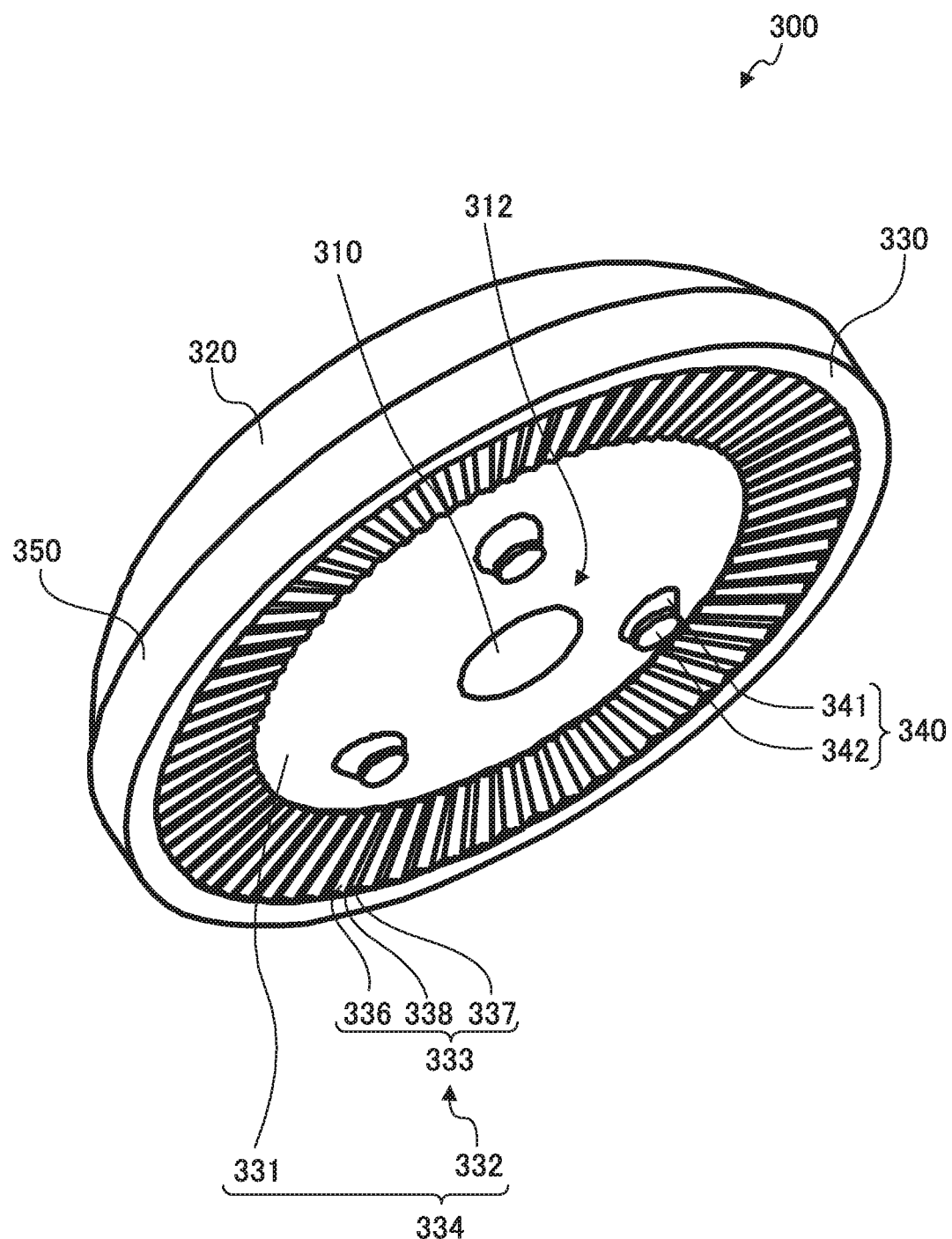
FIG. 4 is a perspective view of a light flux controlling member as viewed from a rear side.
Figure 5A:
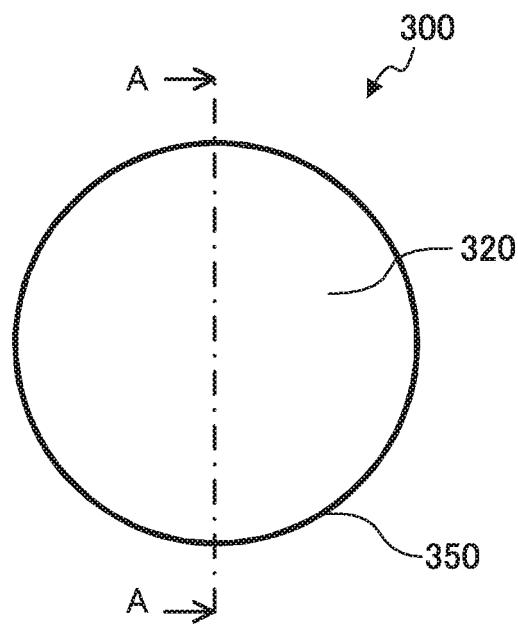
FIGS. 5A to 5D illustrate a configuration of the light flux controlling member.
Figure 5C:
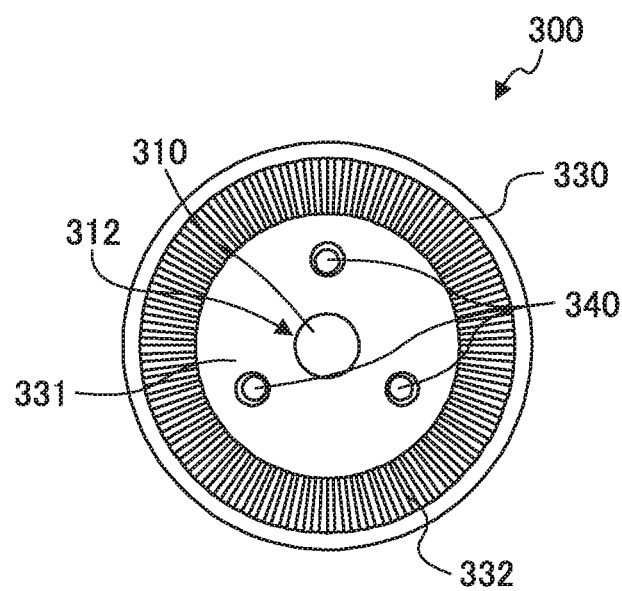
Figure 5B:
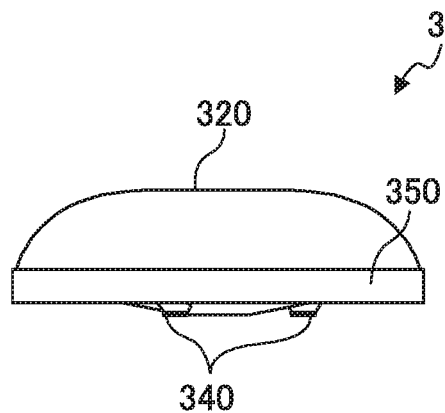
Figure 5D:
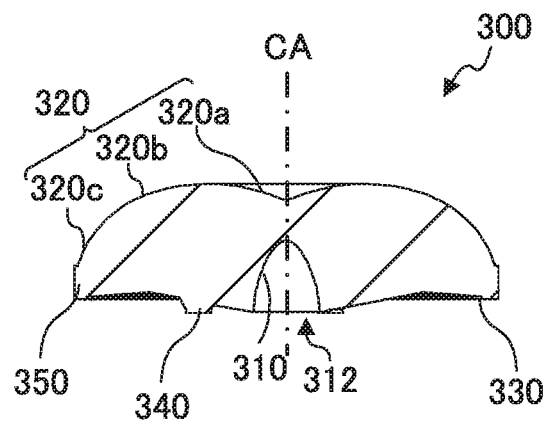
Figure 6A:
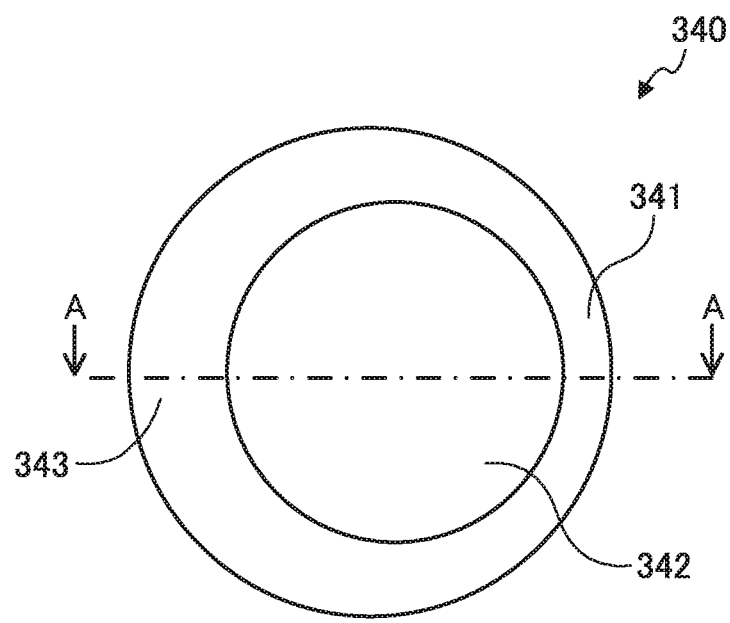
FIGS. 6A and 6B illustrate a configuration of a leg part.
Figure 6B:
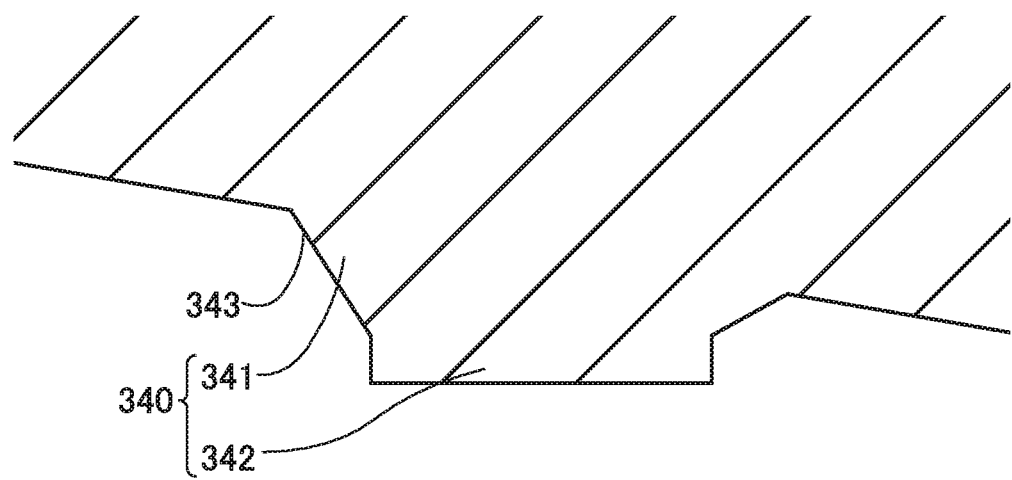

FIGS. 4 to 6B illustrate a configuration of light flux controlling member 300 according to the present embodiment. FIG. 4 is a perspective view of light flux controlling member 300 as viewed from the rear side. FIG. 5A is a plan view of light flux controlling member 300, FIG. 5B is a left side view of light flux controlling member 300, FIG. 5C is a bottom view of light flux controlling member 300, and FIG. 5D is a sectional view taken along line A-A of FIG. 5A. FIG. 6A is a bottom view of leg part 340, and FIG. 6B is a sectional view taken along line A-A of FIG. 6A.

As illustrated in FIGS. 4 to 5D, light flux controlling member 300 includes incidence surface 310, emission surface 320, rear surface 330, and leg part 340. In addition, light flux controlling member 300 may include flange part 350 for easy handling of light flux controlling member 300.

Incidence surface 310 allows, to enter into light flux controlling member 300, the majority of the light emitted from light emitting element 220 while controlling the travelling direction of the light. Incidence surface 310 is an inner surface of recess 312 that is open toward the rear side. Recess 312 is open at a center portion of rear surface 330 in such a manner as to intersect central axis CA of light flux controlling member 300 (optical axis OA of light emitting element 220) (see FIGS. 5C and 5D). That is, incidence surface 310 is disposed so as to intersect central axis CA (optical axis OA). Incidence surface 310 intersects central axis CA of light flux controlling member 300, and is substantially rotationally symmetrical (in the present embodiment, circularly symmetrical) about central axis CA. The opening edge of recess 312 may be located on the front side relative to the lower end of light emitting element 220, or may be located at the same position as the lower end.

Emission surface 320 is disposed on the front side (light diffusion plate 120 side) of light flux controlling member 300. Emission surface 320 emits the light having entered light flux controlling member 300 to the outside while controlling the travelling direction of the light. Emission surface 320 intersects central axis CA, and is rotationally symmetrical (in the present embodiment, circularly symmetrical) about central axis CA.

The shape of emission surface 320 may be set to any shape. In the present embodiment, emission surface 320 includes first emission surface 320a located in a predetermined range around central axis CA, second emission surface 320b continuously formed at the periphery of first emission surface 320a, and third emission surface 320c that connects second emission surface 320b and flange part 350 (see FIG. 5D). First emission surface 320a is a curved surface protruding toward the rear side. Second emission surface 320b is a smooth curved surface protruding frontward and is located at the periphery of first emission surface 320a. Second emission surface 320b has an annular protruding shape. Third emission surface 320c is a curved surface located at the periphery of second emission surface 320b.

Rear surface 330 is located on the rear side of light flux controlling member 300, and is connected with the opening edge of recess 312 such that it extends away from the opening edge of recess 312. The shape of rear surface 330 may be set to any shape. Rear surface 330 may be a flat surface or a grain surface, or, may be provided with other shapes. In the present embodiment, annular groove 334 including a plurality of ridges 333 are disposed in rear surface 330.

Annular groove 334 is formed in rear surface 330 so as to surround recess 312 (incidence surface 310). Annular groove 334 is rotationally symmetrical about central axis CA. Annular groove 334 includes first inner surface 331 disposed on central axis CA side, and second inner surface 332 disposed at a position remote from central axis CA relative to first inner surface 331. In addition, a plurality of ridges 333 are disposed in second inner surface 332.

First inner surface 331 may be parallel to central axis CA, or may be inclined such that the distance thereof from central axis CA increases in the direction toward the front side. In the present embodiment, first inner surface 331 is inclined such that the distance thereof from central axis CA increases in the direction toward the front side. In addition, in the present embodiment, at least a part of first inner surface 331 serves also as a diffusion part. First inner surface 331 may be a smooth surface, or a roughened surface. In the present embodiment, first inner surface 331 is roughened in its entirety.

The diffusion part diffuses light that is emitted from leg part 340 described later and reenters light flux controlling member 300. The shape of the diffusion part may be appropriately selected as long as the travelling direction of the light incident on it can be changed through refraction. The diffusion part may be roughened, or another shape may be disposed. In the present embodiment, first inner surface 331 is roughened as the diffusion part.

Second inner surface 332 is formed on the rear side of light flux controlling member 300 in such a manner as to surround first inner surface 331. Second inner surface 332 is inclined such that the distance thereof from central axis CA increases in the direction toward the rear side.

The position of annular groove 334 in rear surface 330 can be appropriately set. Regarding the position of second inner surface 332, it is preferable that second inner surface 332 be formed in a region where a large quantity of light that is entered from incidence surface 310 and is internally reflected by emission surface 320 arrives. The arrival position of the light internally reflected by emission surface 320 varies depending on various factors such as the shape of emission surface 320, and therefore the position is appropriately set in accordance with light flux controlling member 300.

Each of a plurality of ridges 333 includes flat first inclined surface 336, flat second inclined surface 337, and ridgeline 338 disposed between first inclined surface 336 and second inclined surface 337. Ridgeline 338 is inclined such that the distance thereof from central axis CA increases in the direction toward the rear surface side. Examples of the shape of ridge 333 in a cross section perpendicular to ridgeline 338 include a triangular shape, a triangular shape with chamfered apex, and a semicircular shape. In the present embodiment, the shape of ridge 333 in the cross section perpendicular to ridgeline 338 is a triangular shape. Specifically, in the present embodiment, ridgeline 338 connects between first inclined surface 336 and second inclined surface 337. Each ridge 333 functions as a total reflection prism. Ridges 333 are disposed such that ridges 333 are rotationally symmetrical (n-fold rotational symmetry in the case where n ridges 333 are provided) about central axis CA.

Leg part 340 positions and fixes light flux controlling member 300 to substrate 210. The installation position of leg part 340 may be appropriately set as long as the above-described function can be ensured. In the present embodiment, leg parts 340 are disposed on first inner surface 331 of annular groove 334 at an even interval in the circumferential direction. Also, the number of leg parts 340 may be appropriately set. In the present embodiment, three leg parts 340 are provided.

As illustrated in FIGS. 6A and 6B, leg part 340 includes base 341 on rear surface 330 side, and contact part 342 disposed in base 341. In the present embodiment, base 341 has a substantially truncated cone shape, and contact part 342 has a columnar shape. In the virtual cross-section including central axis CA and leg part 340, the radially outer surface of base 341 functions as partial emission surface 343. Partial emission surface 343 emits upward the light from the side surface of light emitting element 220 that is entered from incidence surface 310 and reaches partial emission surface 343 not by way of other surfaces. In addition, the shape of the radially inner side surface of base 341 may be appropriately selected. In the present embodiment, the radially inner side surface of base 341 has a smooth surface that is inclined such that the distance thereof from central axis CA increases in the direction toward the rear side.

In the virtual cross-section, in leg part 340, an inner base part located radially inside is located on the rear side relative to an outer base part that is located radially outside. The positions of the inner base part and the outer base part of leg part 340 in the direction along central axis CA may be appropriately set in accordance with the light emitted from light emitting element 220 and the shape of incidence surface 310. For example, light flux controlling member 300 can be fixed to substrate 210 by bring the contact surface of contact part 342 into contact with substrate 210 and fixing it with an adhesive agent or the like.

Light Distribution Characteristics

Light paths in light emitting device 200 according to the present embodiment were simulated. For comparison, the same simulation of light paths was conducted with light emitting device 200A according to a comparative example that includes no partial emission surface 343.

Figure 7A:
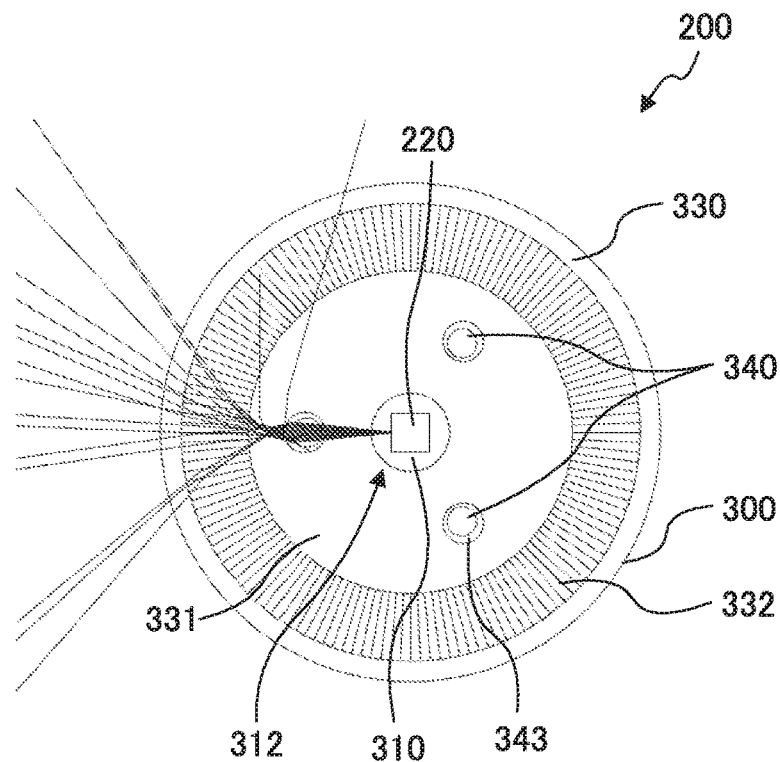
FIGS. 7A and 7B illustrate light paths in a light emitting device according to an embodiment.
Figure 7B:
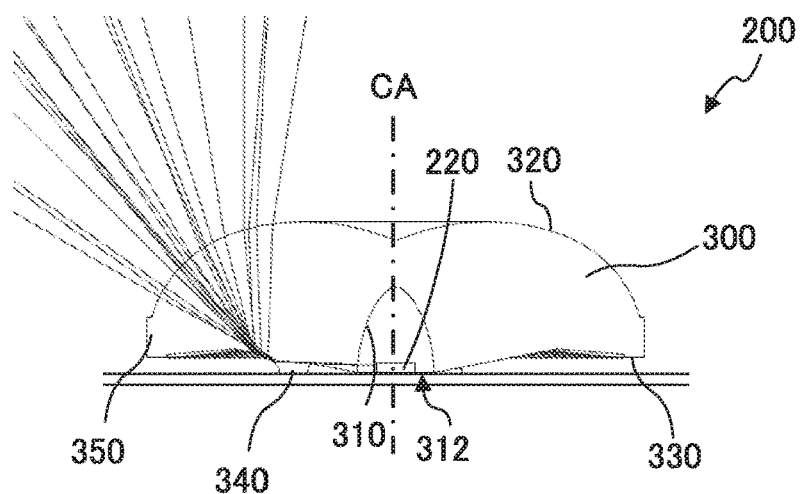
Figure 8A:
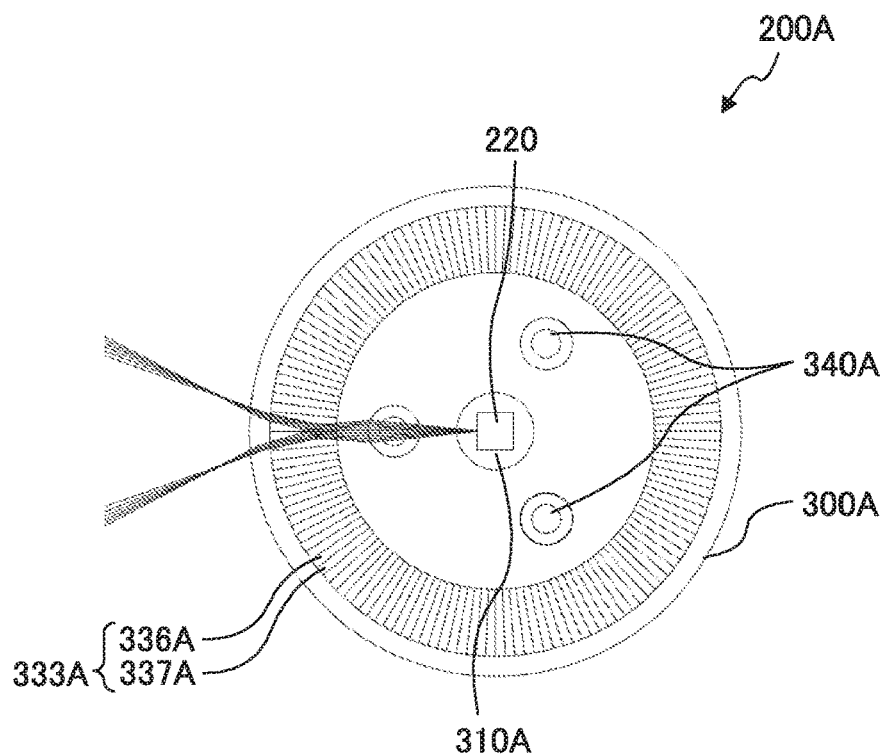
FIGS. 8A and 8B illustrate light paths in a light emitting device according to a comparative example.
Figure 8B:
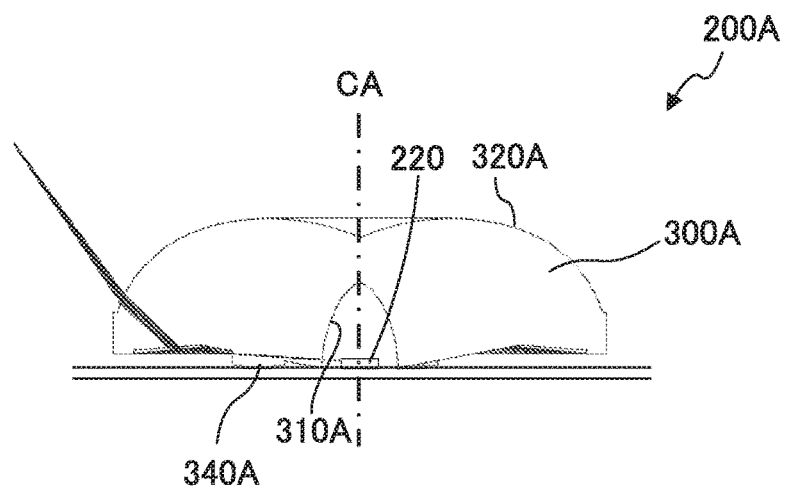

FIGS. 7A to 8B illustrate light paths in light emitting devices 200 and 200A. FIG. 7A illustrates light paths in light emitting device 200 according to the present embodiment as viewed from the rear side, and FIG. 7B illustrates light paths in the cross section including central axis CA. FIG. 8A illustrates light paths in light emitting device 200A according to a comparative example as viewed from the rear side, and FIG. 8B illustrates light paths in the cross section including central axis CA. In FIGS. 7A to 8B, hatching is omitted to illustrate light paths. In addition, in FIGS. 7A to 8B, only light paths of the light emitted from the side surface of light emitting element 220 are illustrated for convenience of description.

As illustrated in FIGS. 7A and 7B, in light emitting device 200 according to the present embodiment, the light emitted from the side surface of light emitting element 220 enters light flux controlling member 300 from incidence surface 310. Next, a part of the light entered from incidence surface 310 is emitted from partial emission surface 343 of leg part 340. Then, the light emitted from partial emission surface 343 reenters light flux controlling member 300 from the diffusion part (first inner surface 331). At this time, the light emitted from partial emission surface 343 is diffused at the diffusion part. The light beams diffused at the diffusion part toward various directions are emitted from emission surface 320 toward various directions. Note that, although not illustrated in the drawings, a part of the light emitted from the top surface of light emitting element 220 is entered from incidence surface 310 and is emitted from emission surface 320 while being controlled to spread with respect to central axis CA. In addition, another part of the light emitted from the top surface of light emitting element 220 is entered from incidence surface 310, and is internally reflected by emission surface 320. The light internally reflected by emission surface 320 is reflected radially outward at ridge 333 so as to be emitted to the outside. Thus, the light incident on leg part 340 is diffused by the diffusion part, and therefore bright spots are less formed in the upper part of light emitting device 200.

As illustrated in FIGS. 8A and 8B, in light emitting device 200A of the comparative example, the light emitted from the side surface of light emitting element 220 enters light flux controlling member 300A from incidence surface 310A. Next, a part of the light entered from incidence surface 310A is emitted to the outside from the side surface of light leg part 340A. Then, the light emitted from the side surface is refracted so as to be focused by the convex lens effect of the side surface of leg part 340A, and reaches ridge 333A. The light having reached ridge 333A reenters light flux controlling member 300A. At this time, the light beams entered from first inclined surface 336A and the light entered from second inclined surface 337A are refracted such that the light beams intersect each other, and are refracted upward of flux controlling member 300A. The light having been reentered light flux controlling member 300A is emitted upward of light flux controlling member 300A from emission surface 320A. As a result, the light incident on leg part 340 is emitted upward as luminous flux, and consequently a bright spot is formed in the upper part of light emitting device 200.

Modification

Configuration of Light Flux Controlling Member

Figure 9A:
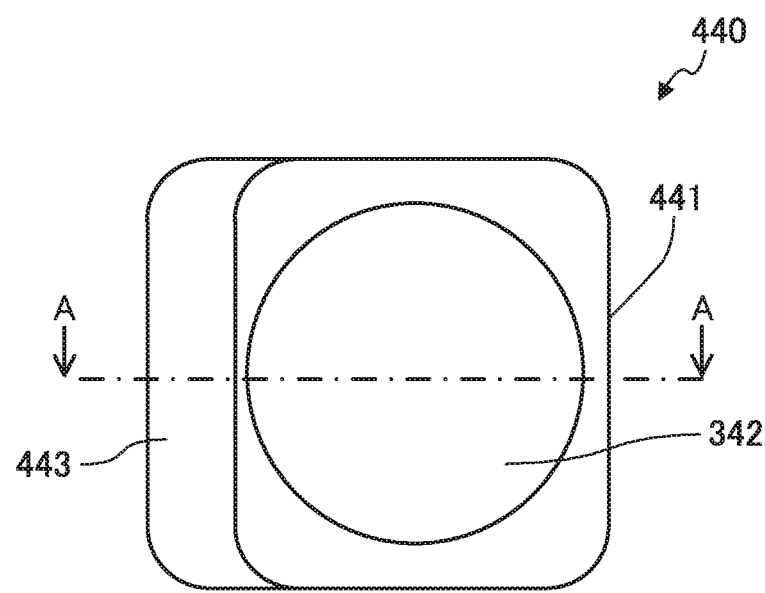
FIGS. 9A and 9B illustrate a configuration of a leg part according to a modification.

A surface light source device according to a modification of the present embodiment is different from the surface light source device according to Embodiment 1 only in the configuration of leg part 440 in light emitting device 500. In view of this, the components similar to those of surface light source device 100 are denoted with the same reference numerals and the description thereof will be omitted. FIG. 9A is a bottom view of leg part 440, and FIG. 9B is a sectional view taken along line A-A of FIG. 9A.

Figure 9B:
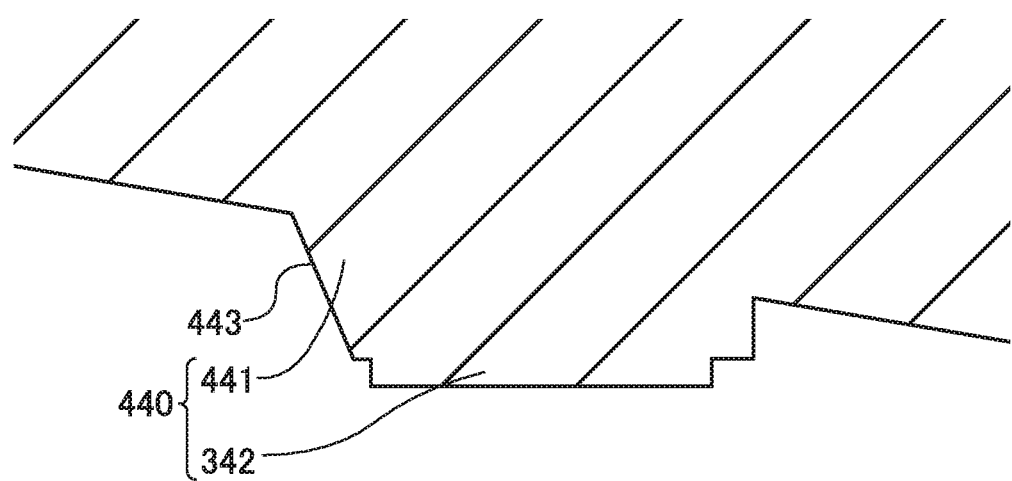

As illustrated in FIGS. 9A and 9B, leg part 440 of light flux controlling member 400 according to the modification includes base 441 disposed on rear surface 330 side, and contact part 342 disposed in base 441. Base 441 is formed in a substantially truncated pyramid having a substantially rectangular bottom surface. Also in the present embodiment, in the radially outer side surface of leg part 440, partial emission surface 443 that is inclined such that the distance thereof from central axis CA increases in the direction toward the front side is disposed. The radially inner side surface of leg part 340 is a flat surface extending along central axis CA.

Light Distribution Characteristics

Figure 10A:
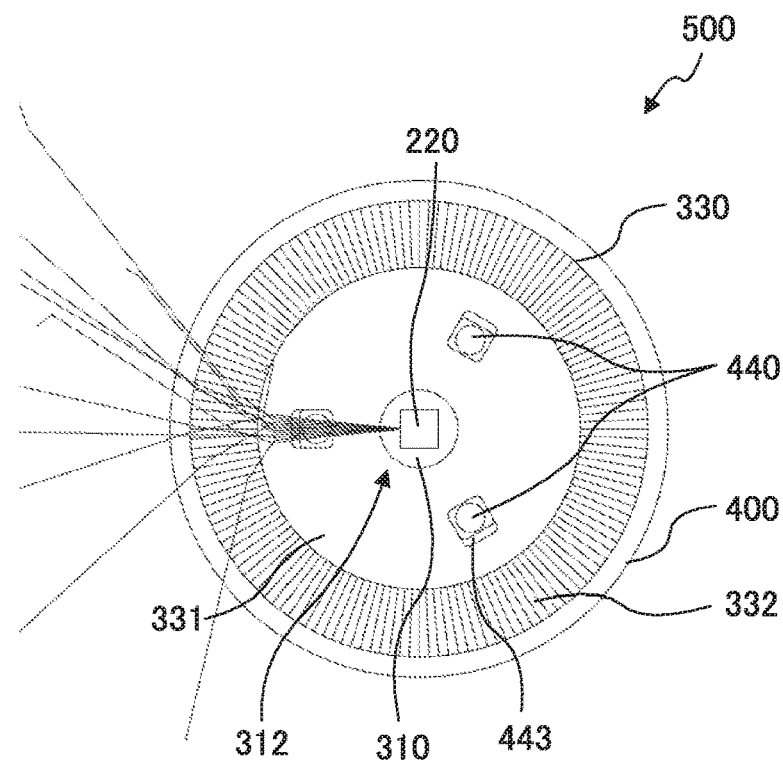
FIGS. 10A and 10B illustrate light paths in a light emitting device according to a modification.
Figure 10B:
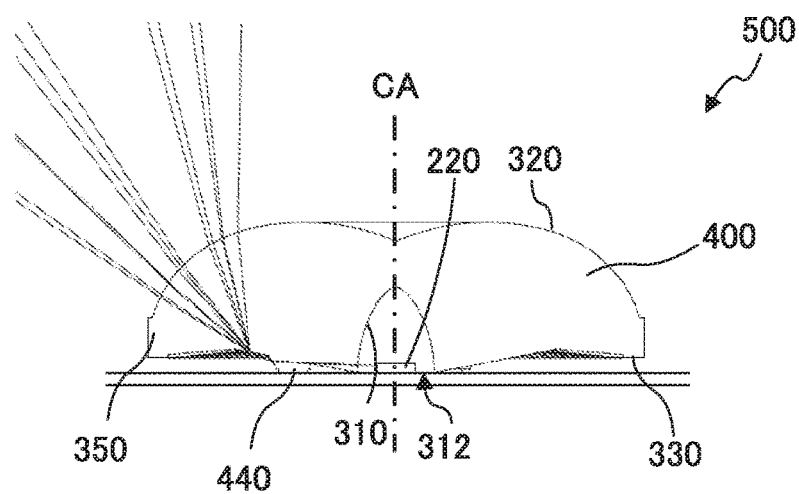

Next, light paths in light emitting device 500 according to the modification were simulated. FIGS. 10A and 10B illustrate light paths in light emitting device 500 according to a modification of the present embodiment. FIG. 10A illustrates light paths in light emitting device 500 according to the present embodiment as viewed from the rear side, and FIG. 10B illustrates light paths in the cross section including central axis CA. In FIGS. 10A and 10B, hatching is omitted to illustrate light paths. In addition, in FIGS. 10A and 10B, only light paths of the light emitted from the side surface of light emitting element 220 are illustrated for convenience of description.

As illustrated in FIGS. 10A and 10B, in light emitting device 500 according to the present embodiment, the light emitted from the side surface of light emitting element 220 enters light flux controlling member 400 from incidence surface 310. Next, a part of the light entered from incidence surface 310 is emitted from partial emission surface 443 of leg part 440. Then, the light emitted from partial emission surface 443 reenters light flux controlling member 400 from the diffusion part (first inner surface 331). At this time, the light emitted from partial emission surface 443 is diffused at the diffusion part. The light beams diffused at the diffusion part toward various directions are emitted from emission surface 320 toward various directions. Note that, although not illustrated in the drawings, a part of the light emitted from the top surface of light emitting element 220 is entered from incidence surface 310 such that the light is controlled to spread with respect to central axis CA and then emitted from emission surface 320. In addition, another part of the light emitted from the top surface of light emitting element 220 is entered from incidence surface 310 so as to be internally reflected by emission surface 320. The light internally reflected by emission surface 320 is reflected radially outward at ridge 333 so as to be emitted to the outside. With this configuration, the light incident on leg part 440 is diffused by the diffusion part, and thus bright spots are less formed in the upper part of light emitting device 500.

Effect

As described above, since light beams emitted from leg parts 340 and 440 are diffused at the diffusion part in light emitting devices 200 and 500 according to the present embodiment, it is possible to reduce the light beams from leg parts 340 and 440 that is directed toward the region immediately above light emitting devices 200 and 500. Thus, no bright spot is formed in the region immediately above light emitting devices 200 and 500.

This application is entitled to and claims the benefit of Japanese Patent Application No. 2017-168618 filed on Sep. 1, 2017, the disclosure each of which including the specification, drawings and abstract is incorporated herein by reference in its entirety.

INDUSTRIAL APPLICABILITY

The light emitting device and the surface light source device according to the embodiments of the present invention are applicable to, for example, a backlight of a liquid crystal display apparatus, a generally-used illumination apparatuses, and the like.

REFERENCE SIGNS LIST

100 Surface light source device
100' Display device
107 Display member
110 Housing
112 Bottom plate
114 Top plate
120 Light diffusion plate
200, 200A, 500 Light emitting device
210 Substrate
220 Light emitting element
300, 300A, 400 Light flux controlling member
310, 310A Incidence surface
312 Recess
320, 320A Emission surface
320a First emission surface
320b Second emission surface
320c Third emission surface
330 Rear surface
331 First inner surface
332 Second inner surface
333, 333A Ridge
336, 336A First inclined surface
337, 337A Second inclined surface
338 Ridgeline
340, 340A, 440 Leg part
341, 441 Base
342 Contact part
350 Flange part
CA Central axis of light flux controlling member
OA Optical axis of light emitting element

What is claimed is:

1. A light emitting device comprising:
a light emitting element; and
a light flux controlling member configured to control a distribution of light emitted from the light emitting element;
wherein the light flux controlling member includes:
an incidence surface that is an inner surface of a recess that is open at a rear side to intersect a central axis of the light flux controlling member, the incidence surface being configured to allow incidence of the light emitted from the light emitting element;
an emission surface disposed on a front side to intersect the central axis, the emission surface being configured to emit, to outside, light entered from the incidence surface;
a rear surface extending away from an opening edge of the recess;
a leg part protruding from the rear surface toward the rear side; and
a diffusion part disposed in the rear surface in a region outside the leg part in a radial direction, the diffusion part being configured to diffuse light incident on the diffusion part;
wherein the opening edge of the recess is located on the rear side relative to a front surface of the light emitting element;
wherein an inner base part of the leg part is located on the rear side relative to an outer base part of the leg part, the inner base part being located on inside in the leg part in the radial direction, the outer base part being located on outside in the leg part in the radial direction;
wherein a radially outer side surface of the leg part includes a partial emission surface that is inclined such that a distance of the partial emission surface from the central axis increases in a direction toward the front side, the radially outer side surface being located on an outer side in the leg part in the radial direction; and
wherein a part of light emitted from a side surface of the light emitting element is emitted to outside from the partial emission surface not by way of other surfaces after being entered from the incidence surface, and is then reentered into the light flux controlling member from the diffusion part.

2. The light emitting device according to claim 1,
wherein an annular groove having a circular ring shape is disposed in the rear surface to surround the opening edge of the recess, the annular groove including a first inner surface disposed on a central axis side, and a second inner surface farther from the central axis than the first inner surface;
wherein in the second inner surface, a plurality of ridges each of which include a first inclined surface, a second inclined surface, and a ridgeline disposed between the first inclined surface and the second inclined surface are disposed, each of the plurality of ridges being inclined such that the distance of each of the plurality of ridges from the central axis increases in a direction toward the rear side; and
wherein the diffusion part includes at least a part of the first inner surface.

3. A surface light source device comprising:
the light emitting device according to claim 2; and
a light diffusion member configured to allow the light emitted from the light emitting device to pass through the light diffusion member while diffusing the light.

4. A display device comprising:
the surface light source device according to claim 3; and
a display member configured to be irradiated with light emitted from the surface light source device.

5. A surface light source device comprising:
the light emitting device according to claim 1; and
a light diffusion member configured to allow the light emitted from the light emitting device to pass through the light diffusion member while diffusing the light.

6. A display device comprising:
the surface light source device according to claim 5; and
a display member configured to be irradiated with light emitted from the surface light source device.

* * * * *